United States Patent [19]

Pernici et al.

[11] Patent Number: 5,212,455
[45] Date of Patent: May 18, 1993

[54] DIFFERENTIAL OUTPUT, POWER, CMOS, OPERATIONAL AMPLIFIER

[75] Inventors: Sergio Pernici, Bergamo; Germano Nicollini, Piacenza, both of Italy

[73] Assignee: SGS-Thomson Microelectronics s.r.l., Milan, Italy

[21] Appl. No.: 811,153

[22] Filed: Dec. 19, 1991

[30] Foreign Application Priority Data

Dec. 21, 1990 [IT]  Italy ................................ 83652 A/90

[51] Int. Cl.$^5$ .............................................. H03F 3/45
[52] U.S. Cl. ................................... 330/253; 330/255; 330/257
[58] Field of Search ................ 330/253, 255, 257, 258, 330/311, 9

[56] References Cited

U.S. PATENT DOCUMENTS

| | | | |
|---|---|---|---|
| 4,697,152 | 9/1987 | Westwick | 330/9 |
| 4,794,349 | 12/1988 | Senderowicz et al. | 330/253 |
| 4,829,266 | 5/1989 | Pernici | 330/253 |
| 4,912,425 | 3/1990 | Kobayashi et al. | 330/253 |

FOREIGN PATENT DOCUMENTS

| | | |
|---|---|---|
| 0138261 | 4/1985 | European Pat. Off. |
| 3725323A1 | 2/1988 | Fed. Rep. of Germany |
| 59-156012 | 9/1984 | Japan ................................ 330/253 |

OTHER PUBLICATIONS

Tomasini, et al., "A Fully Differential CMOS Line Driver for ISDN," IEEE Journal of Solid-State Circuits 25(2):546–554, Apr. 25th 1990.

Primary Examiner—Robert J. Pascal
Assistant Examiner—Tan Dinh
Attorney, Agent, or Firm—Seed & Berry

[57] ABSTRACT

A power CMOS operational amplifier with a differential output, having an intrinsically stable current absorption under rest conditions, comprises two symmetric branches, each comprising a first folded cascode input inverting stage, a level shifting circuit, a second currant mirror type noninverting amplifying stage and a third output inverting stage, constituted by a complementary pair of transistors, connected in a common source configuration between the supply rails and driven by the output of the second noninverting stage and by the output of the level shifting circuit. Frequency compensation is accomplished by means of two capacitors connected between each of the two output terminals of the amplifier and the output of the first inverting stage and a node of the output branch of the noninverting current mirror stage. A single common mode feedback network stabilizes both symmetric branches of the amplifier.

10 Claims, 2 Drawing Sheets

DIFFERENTIAL OUTPUT, POWER, CMOS, OPERATIONAL AMPLIFIER

DESCRIPTION

1. Technical Field

The present invention relates to a power operational amplifier, realized in CMOS technology and having a differential output.

2. Background of the Invention

By utilizing a CMOS manufacturing process complex systems comprising analog portions and digital portions sharing the same supply rail (usually at 5V), may be combined in a single integrated circuit. The so-called power operational amplifier is often present among analog portions. This circuit is required for driving external loads of the integrated circuit (e.g., a loudspeaker or a telephone earpiece). These external loads may be characterized by a resistance as low as 50 Ohm and by a capacity as high as several hundreds picoFarad (pF). The operational amplifier must drive such a heavy load with a low distortion up to a frequency in the order of ten kiloHertz (kHz). To do so it must be able to deliver high current peaks in response to a signal and to have a low output impedance. Nevertheless it is desirable that, in the absence of a signal, the circuit have a relatively low and well-controlled current absorption. Moreover the maximum signal voltage that can be supplied to the load should have a value as close as possible to the supply voltage (i.e., an output signal swing (dynamic) as large as possible). A further fundamental requirement is a good noise rejection on the supply rails. Finally it is important that the circuit occupy a relatively small integration area.

In most cases, the operational amplifier is of the so-called single-ended output type, and in this most common configuration many types of amplifiers are known which generally employ an amplifying transconductance stage as the first or input stage, while a source follower stage or a push pull stage is used as output stage, as it is well known to the technician of ordinary skill in the art. Many of these circuits are reviewed in the volume "Analog MOS Integrated Circuits For Signal Processing," edited by Gregorian, Temes.

In an operational amplifier having a single-ended output any disturbance on the supply rails turns itself into a disturbance on the driven external load (this effect increases with an increase of the frequency of the disturbance itself). In a fully differential circuit, due to the physical symmetry of the structure, the disturbance is equally coupled with the two outputs and as a common mode event does not affect the load, even at very high frequencies. In other words, a fully differential amplifier intrinsically possesses a very high rejection characteristic for disturbances on the supply rails and this assumes a particular importance in complex integrated systems, wherein quite considerable disturbances on the supply rails due to the switchings of the logic circuits integrated on the same chip may occur.

The rare examples of known power CMOS amplifiers with a differential output are generally quite complex and, in spite of the intrinsic advantages of this type of operational amplifier, they haven't had widespread utilization.

Thus a demand and a utility exist for a CMOS power operational amplifier with a differential output, having a high overall performance and a relatively simple circuit easily integrable in a relatively small area.

SUMMARY OF THE INVENTION

This objective is attained by the present invention whose object is a particularly simple power CMOS operational amplifier with a differential output, wherein a single and simple common mode feedback loop exerts a common mode control on all the cascaded stages of the operational amplifier. Moreover, the amplifier of the present invention has an intrinsically stable DC current level under rest conditions and thus does not need a dedicated control circuit for controlling this mechanism of instability, which usually is an effect of unavoidable asymmetries among elements forming pairs or groups of transistors which ideally should have been exactly similar among each other (i.e., offsets due to local differences inevitably introduced by the manufacturing process, process spread).

BRIEF DESCRIPTION OF THE DRAWINGS

The different peculiar aspects and advantages of the circuit of the invention will become clear through the following description of an embodiment thereof and by reference to the attached drawings, wherein.

DETAILED DESCRIPTION OF THE INVENTION

Figure 1:
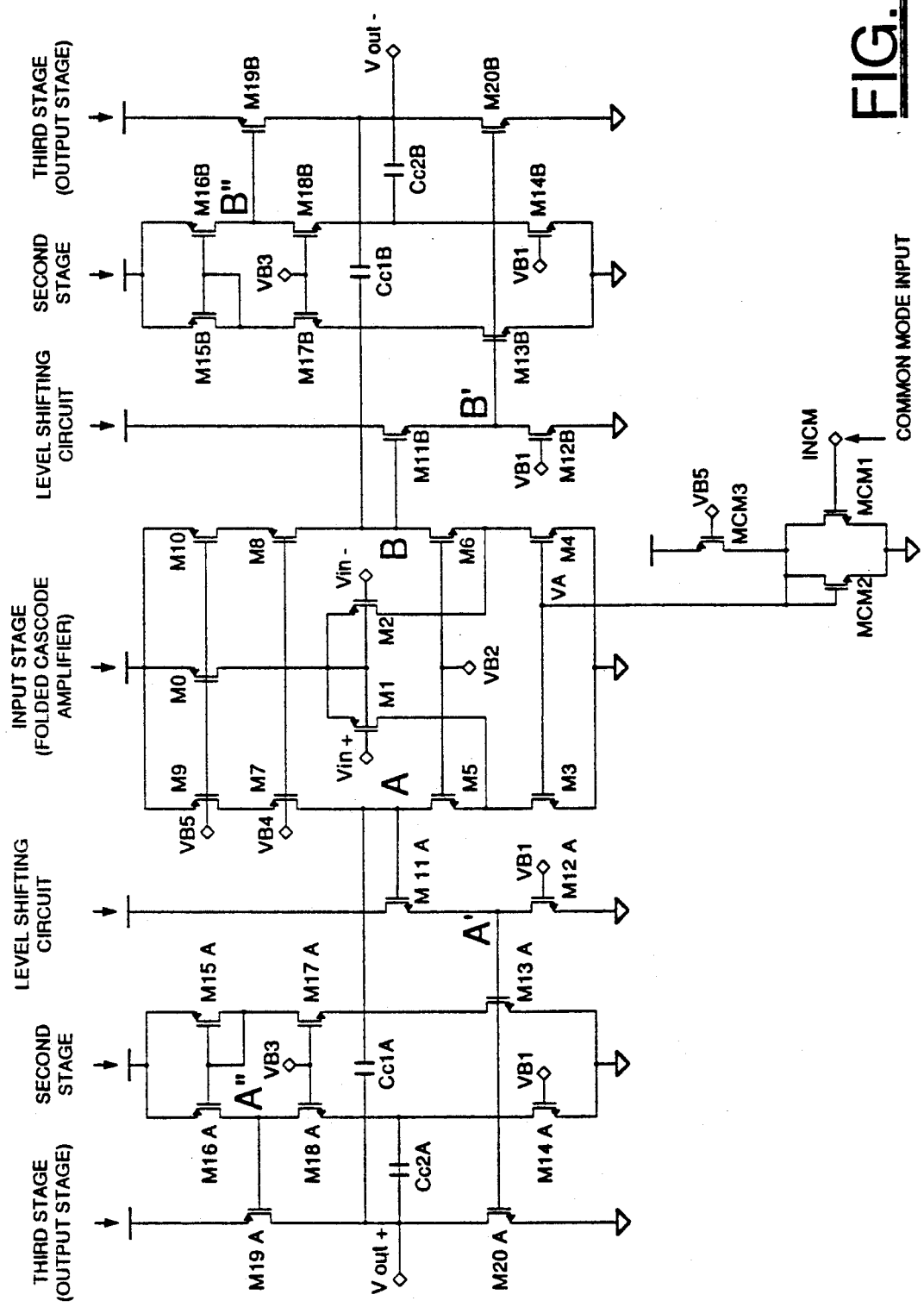
FIG. 1 is a complete circuit diagram of an operational amplifier made in accordance with to the present invention.

With reference to FIG. 1, the operational amplifier is formed by two essentially symmetrical branches. Each branch comprises a first input inverting stage of the so-called folded cascode type which is formed by transistors M0, M1, M2, M3, M4, M5, M6, M7, M8, M9 and M10. The terminals VB1, VB2, VB3, VB4 and VB5 are circuit biasing terminals to which a respective constant voltage may be applied. The operation of this type of differential transconductance input stage is well-known to a technician of ordinary skill in the art. When in response to a signal applied between the two differential input terminals: $V_{in+}$ and $V_{in-}$, the input voltage $V_{in+}$ increases and the voltage $V_{in-}$ decreases, an amplified voltage rise on the output node B and a symmetric voltage decrease on the output node A occur.

Each of the two symmetric branches of the differential amplifier comprises also a level shifting circuit, which is formed by transistors M11A and M12A for one branch, and by M11B and M12B for the other branch. This level shifting circuit is essentially a source follower whose function is to shift the voltage level and therefore any signal present on a respective input node: A or B' is reproduced on the respective output node: A' or B'. In absence of this level shifting circuit the noninverting amplifying stage that follows would impose a DC voltage level on the output node of the first input inverting stage too low for a correct operation of the latter.

The voltages of the output nodes of the level shifting circuits: A' and B', are applied to the input nodes of second noninverting amplifying stages, respectively, which are formed by transistors M13A, M14A, M15A, M16A, M17A and M18A for one branch and by transistors M13B, M14B, M15B, M16B, M17B and M18B, for the other symmetric branch of the amplifier, respectively. This second stage is essentially a noninverting amplifying stage. In absence of an input signal the currents through the MOS transistors are all equal to each other as the current mirror formed by transistors M15 (A or B) and M16 (A or B) keeps identical the currents in the two branches of the circuit of these second stages. If the input voltage increases, the current through transistor M13 (A or B) and therefore also through transistor M15 (A or B) increases. This current is mirrored in transistor M16 (A or B), which thus conducts a current larger than the one supplied by the constant current generator M14 (A or B). Therefore also the voltage on the respective output node (A″ or B″) of the second noninverting amplifying stage increases as a function of the voltage on its input (A′ or B′).

The third amplifying stage, i.e., the output stage, is an inverting stage formed by a p-channel transistor (M19A and M19B, respectively) and by an n-channel transistor (M20A and M20B, respectively) connected in a common source configuration between the two supply rails of the circuit. The gate of the p-channel transistor is driven by the output signal of the second noninverting amplifying stage, while the gate of the n-channel transistor is driven by the output signal of the level shifting circuit, which is a replica of the output signal of the first inverting input stage. When the voltage at the input (nodes A′ and B′) of the second noninverting amplifying stage increases, the current through the n-channel transistor (M2C) of the output stage, which is directly coupled with this input node, increases, while the current through the p-channel transistor (M19) of the output stage, whose gate is connected to the output of the second noninverting amplifying stage (nodes A″ and B″), decreases. In fact, as said above, the voltage of this output node also increases as the output voltage of the first input stage, thus causing a decrease of the voltage between the gate and the source of transistor M19. Because of this unbalance between the currents through the p-channel and the n-channel transistors of the output stage, caused by the input signal, a current flow through the output node and the external load occurs.

Because of the presence of three amplifying stages, the circuit has a very high overall gain. By virtue of the preceding amplifying stages, the gates of the transistors of the two symmetric output stages have very large voltage swings, close to the supply voltage. For this reason, the two output stages, if their physical structure is properly sized, may deliver a very large current to the load, as a function of the input signal.

Figure 2:
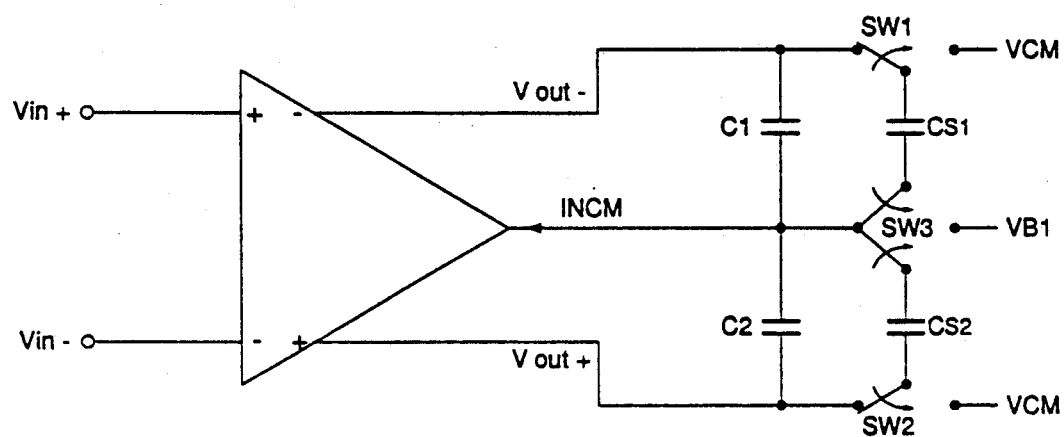
FIG. 2 is a functional diagram of an external capacitor network, employed for controlling the amplifier's common mode.

The circuit of the differential amplifier may usefully comprise a common mode feedback circuit, of a type usually defined as "dynamic" type, which is extremely easy to realize. This common mode control circuit utilizes, as shown in FIG. 2, two capacitors C1 and C2 connected in-series to each other and between the two amplifier's output terminals: $V_{out+}$ and $V_{out-}$. Connected in parallel to these two capacitors, there is a second pair of capacitors, $C_{s1}$ and $C_{s2}$, respectively, and each of these capacitors is periodically disconnected, by means of the integrated C(MOS) switches SW1, SW2 and SW3, which are driven by a logic control signal, from the respective capacitor it is combined with and is charged to a predetermined common mode voltage at the VCM output of the amplifier minus a certain fixed bias voltage VB1 (this circuit is well-known in the literature and is described in the text "Design of MOS VLSI Circuits For Telecommunication," by Tsividis, Antonietti, page 207).

These pairs of capacitors are such that, if the average value of the output voltages $V_{out+}$ and $V_{out-}$ changes, the voltage of the node INCM, to which they are connected, varies of the same amount. This node, INCM, an acronym for Common Mode INput node of the amplifier, is constituted, as shown in FIG. 1, by the gate of the transistors MCM2 and MCM3, forms a simple voltage inverter, whose output is connected to the gates of transistors M3 and M4 of the input stage (node VA). When a common mode voltage increase occurs on the operational amplifier outputs, also the voltage of the node INCM increases, as described above. The voltage present on this node is inverted by the circuit formed by transistors MCM1, MCM2 and MCM3, and is applied to the gate of transistors M3 and M4. By assuming an increase of the voltage of the node INCM, a decrease of the voltage applied to the gates of transistors M3 and M4 is obtained and, therefore, a decrease of the current flowing through these transistors. Since in absence of an input signal these currents balance those flowing through M9 and M10, in case of a common mode unbalance, an unbalance of these currents also occurs. In the case considered, the decrease of the currents flowing through M3 and M4 makes the output nodes (A and B) of the first input stages raise in voltage and this voltage increase causes a similar voltage increase at the output nodes of the second noninverting amplifying stages, A″ and B″, and a voltage decrease on the operational amplifier output terminals: $V_{out+}$ and $V_{out-}$. The assumed increase of the output voltages is thus compensated and nullified by the common mode feedback circuit which forces, as a consequence, a voltage decrease.

A remarkable advantage of this solution is that the feedback circuit for controlling the amplifier common mode does not introduce any factor of nonideality in the amplifier response because is formed solely by capacitors, which are linear and nondissipating elements, and by a very simple voltage inverting circuit which may be easily designed so as to avoid the introduction of any disturbance. The latter circuit introduces merely a very high frequency pole whose effects are negligible.

The frequency compensation networks of the differential operational amplifier employ the capacitors Cc1A and Cc2A for the first of the two symmetric branches and Cc1B and Cc2B for the second branch of the differential amplifier, respectively, as shown in FIG. 1. For each of the two symmetric branches, the two capacitors are connected between the respective output node of the amplifier and the output node (A or B) of the input stage and the source of transistor M18 (B or A), respectively. The transistor M18 (B or A) or the output branch of the second noninverting amplifying stage, has its gate kept at a fixed voltage. This connection is original and differs from the known connection, referred to as "Miller's compensating nested connection," wherein the second capacitor of each pair (Cc2A and Cc2B) is connected, by contrast, to the output node of the respective second amplifying stage (see J. H. Huijsing, "Low Voltage Operation Amplifier With Rail To Rail Input And Output Range," JSSC, Dec. 85). The advantage of the frequency compensating network of the differential operational amplifier of the invention consists in that the pole at the output of the operational amplifier is advantageously shifted toward the high frequency range without any problem, thus enhancing the amplifier stability. This arrangement, previously employed solely in operational amplifiers having only two amplifying stages (see D. B. Ribner, M. A. Copland, "Design Technics For Cascoded Op. Amps. With Improved PSRR And Common Mode Input Range," JSSC, December '84), proves itself more effective if implemented in an amplifier having three amplifying stages, because the number of poles increases and thus becomes more important to increase as much as possible the frequency of the nondominating poles so that they do not affect the response.

A further remarkable advantage of the amplifier of the invention is that it does not need any additional circuit for controlling the current level under rest conditions. Its peculiar circuit architecture ensures, in fact, an intrinsic control of the bias current level. As pointed out hereinabove, a bias current increase may be due, in certain integrated structures, to accidental asymmetries among elements of pairs or groups of transistors which ideally should be identical to each other (offsets due to the fabrication process spread. In the circuit of the amplifier of the instant invention, any kind of presumable offset will not produce a significant increase of the total power dissipation under rest conditions. In fact, a skilled technician will easily recognize, by analyzing the effects of different presumable offsets, that they will always cause opposite current variations in n-channel transistors and in p-channel transistors of the two symmetric output stages. Thus, the excess current in any one of the two transistors must always flow through the external load, thus causing a consequent variation in the output voltage and the intervention of the negative external feedback network which is always present between input and output nodes of any operational amplifier. In presence of an output unbalance this negative feedback causes an input unbalance which counteracts the output unbalance, thus restoring the proper current levels.

We claim:

1. Power CMOS operational amplifier with a differential output having an intrinsically stable current absorption under rest conditions, comprises two symmetric branches, each branch comprises:
    a first input inverting stage having a folded cascode configuration, capable of producing on a respective output node a voltage signal replica of a voltage applied on a respective input terminal of the differential amplifier;
    a level shifting circuit, having an input coupled to said output node of the first stage and en output node and capable of producing on said output node a replica of the voltage signal present at its input, shifted in level by a predetermined amount;
    a second noninverting amplifying stage comprising a current mirror having an input branch which comprises at least one transistor, whose gate constitutes an input and is connected to the output of said level shifting circuit, and an output branch which comprises at least a transistor whose gate is driven by a constant voltage, and having a drain connected to an output node of the stage, and producing on said output node an amplified voltage replica of the output voltage produced by said level shifting circuit;
    a third inverting power output stage formed by a p-channel transistor and by an n-channel transistor connected in a common source configuration between the supply rails of the circuit, the gate of the p-channel transistor being driven by the output signal of said second noninverting amplifying stage and the gate of the n-channel transistor being driven by the output signal produced by said level shifting circuit, said two transistors having their drains connected in common to a respective differential output terminal of the amplifier;
    a frequency compensating network formed by a first capacitor connected between said differential output terminal and said output node of said first input inverting stage and by a second capacitor connected between said differential output terminal and a source of said transistor of the output branch of said second noninverting amplifying stage; and
    a common mode control feedback network.

2. A CMOS operational amplifier according to claim 1, characterized by the fact that said feedback network for common mode control is formed by:
    a first and a second capacitor connected in series to each other between said differential output terminals of the amplifier;
    a third and a fourth capacitor intermittently connected in parallel to said first and to said second capacitor, respectively, by means of switches, driven by a logic control signal, and, alternately, to three terminals to which are functionally applied a preset common mode constant reference voltage and a constant reference bias voltage; an intermediate node of said series connected capacitors between the amplifier differential output terminals being connected to a common mode input terminal of the amplifier, to which the gate of a first input transistor of a voltage inverting circuit, whose output is functionally connected to the gates of two output transistors of the first inverting input stages of the differential amplifier, for compensating, through an increase or through a decrease of the current flowing through said output transistors of the first inverting input stage, a decrease or an increase of the voltage present on said common mode input terminal of the amplifier.

3. A power CMOS operational amplifier with a differential output having an intrinsically stable current absorption under rest conditions, and having two symmetrical branches, each branch of said amplifier comprising:
    an inverting input circuit electrically coupled to an input to generate an inverted amplified signal;
    a level shifting circuit electrically coupled to said inverted amplified signal to generate a shifted signal;
    a non-inverting amplifier circuit electrically coupled to said shifted signal to generate an amplified shifted signal;
    a CMOS power output circuit electrically coupled to said amplified shifted signal and to said shifted to generate an output signal;
    a frequency compensation circuit formed by a first capacitor connected between said output signal and said inverted amplified signal, and by a second capacitor connected between said output and said non-inverting amplifier circuit;
    a common mode feedback network formed by a first and second feedback capacitors connected in series with each other between the differential output terminals of the operational amplifier with the common node between said first and second feedback capacitors being connected to a common input on the operational amplifier; and
    a third and fourth feedback capacitors periodically connected in parallel to said first and second feedback capacitors, respectively, by means of a plurality of switches and alternately connected through said plurality of switches to a preset common node reference voltage, said common mode feedback network generating a voltage, in response to the voltage on said common mode input, to increase or decrease the voltage generated by said first and second inverting input circuits.

4. The power CMOS operational amplifier of claim 3 wherein each of said inverting input amplifiers uses a folded cascode configuration.

5. The power CMOS operational amplifier of claim 3 wherein each of said non-inverting amplifiers uses a current mirror configuration in which the gate of at least one MOS transistor in the current mirror is held at a fixed voltage.

6. The power CMOS operational amplifier of claim 3 wherein each of said non-inverting amplifiers uses a current mirror configuration so that currents through said non-inverting amplifier are equal in the branches of the current mirror when the operational amplifier is at rest.

7. A power CMOS operational amplifier with a differential output having an intrinsically stable current absorption under rest conditions, said amplifier comprising:

first and second inputs to the operational amplifier for the introduction of a differential input signal;

first and second symmetrical branches for amplifying said differential input signal;

first and second inverting input stages electrically coupled to said first and second inputs, respectively, to receive said differential input signal and to generate a first and second inverted amplified output signals;

first and second level shifting stages, electrically coupled to said first and second inverted amplified output signals, respectively, to generate first and second shifted signals of the same polarity as said first and second inverted amplified output signals and shifted in level by a predetermined amount;

first and second amplifier stages electrically coupled to said first and second shifted signals, respectively, to produce first and second amplified signals;

first and second CMOS power stages each formed by a first and second pair of complementary MOS transistors, the first complementary MOS transistor of said first pair of complementary MOS transistors being electrically coupled to said first amplified signal, the second complementary MOS transistor of said first pair of complementary MOS transistors being electrically coupled to said first shifted signal, the first complementary MOS transistor of said second pair of complementary MOS transistors being electrically coupled to said second amplified signal, the second complementary MOS transistor of said second pair of complementary MOS transistors being electrically coupled to said second shifted signal, to produce a first and second power outputs, respectively; and first and second frequency compensation networks, electrically coupled to said first and second symmetrical branches, respectively, said first frequency compensation circuit formed by a first capacitor connected between said first power output and said first inverted amplified output signal, by a second capacitor connected between said first power output and said first amplifier stage, said second frequency compensation circuit formed by a third capacitor connected between said second power output and said second inverted amplified output signal, and by a fourth capacitor connected between said second power output and said second amplifier stage.

8. The power CMOS operational amplifier of claim 7 wherein said first and second inverting input stages have a folded cascode configuration.

9. The power CMOS operational amplifier of claim 7 wherein each of said first and second amplifier stages uses a current mirror configuration in which the gate of at least one MOS transistor in the current mirror is held at a fixed voltage.

10. The power CMOS operational amplifier of claim 7 wherein said first and second amplifier stages are non-inverting stages with a current mirror configuration so that currents through said non-inverting amplifier are equal in the branches of the current mirror when the operational amplifier is at rest.

* * * * *

UNITED STATES PATENT AND TRADEMARK OFFICE
CERTIFICATE OF CORRECTION

PATENT NO. : 5,212,455
DATED : May 18, 1993
INVENTOR(S) : Sergio Pernici and Germano Nicollini It is certified that error appears in the above-identified patent and that said Letters Patent is hereby corrected as shown below:

In column 5, claim 1, line 47, please delete "en" and substitute therefor --an--.

In column 6, claim 3, line 53, after "to said shifted" and before "to generate", please insert --signal.

In column 6, claim 3, line 65, after "to a common" and before "input on the", please insert --mode--.

In column 7, claim 3, line 3, please delete "node" and substitute therefor --mode--.

Signed and Sealed this

Twenty-first Day of September, 1993

Attest:

BRUCE LEHMAN

Attesting Officer

Commissioner of Patents and Trademarks